United States Patent
Milo et al.

(10) Patent No.: US 12,341,126 B2
(45) Date of Patent: Jun. 24, 2025

(54) BUMP TO PACKAGE SUBSTRATE SOLDER JOINT

(71) Applicant: Texas Instruments Incorporated, Dallas, TX (US)

(72) Inventors: Dolores Milo, Baguio (PH); Michael Milo, Baguio (PH); Allen Dee, Baguio (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 230 days.

(21) Appl. No.: 17/730,670

(22) Filed: Apr. 27, 2022

(65) Prior Publication Data

US 2023/0352441 A1 Nov. 2, 2023

(51) Int. Cl.
*H01L 23/00* (2006.01)

(52) U.S. Cl.
CPC .............. *H01L 24/81* (2013.01); *H01L 24/16* (2013.01); *H01L 24/75* (2013.01); *H01L 2224/16245* (2013.01); *H01L 2224/75252* (2013.01); *H01L 2224/75253* (2013.01); *H01L 2224/75753* (2013.01); *H01L 2224/81191* (2013.01); *H01L 2224/812* (2013.01); *H01L 2224/81815* (2013.01); *H01L 2224/8191* (2013.01)

(58) Field of Classification Search
CPC ......... H01L 24/81; H01L 24/16; H01L 24/75; H01L 2224/16245; H01L 2224/75252; H01L 2224/75253; H01L 2224/75753; H01L 2224/81191; H01L 2224/812; H01L 2224/81815; H01L 2224/8191; H01L 2224/81024; H01L 2224/81238
See application file for complete search history.

(56) References Cited

U.S. PATENT DOCUMENTS

| | | | |
|---|---|---|---|
| 6,280,858 B1 * | 8/2001 | Teshima | H05K 3/3463 428/646 |
| 9,385,098 B2 | 7/2016 | Zhang et al. | |
| 2005/0133488 A1 * | 6/2005 | Blankenship | B23K 9/1068 219/130.01 |
| 2005/0133573 A1 * | 6/2005 | Bayot | H05K 3/3489 228/246 |
| 2006/0069466 A1 * | 3/2006 | Kato | B25J 9/1682 700/264 |
| 2019/0335119 A1 * | 10/2019 | Shimizu | H04N 25/40 |
| 2020/0350285 A1 * | 11/2020 | Ho | H01L 24/13 |
| 2021/0111136 A1 * | 4/2021 | Matsuura | H01L 24/03 |

OTHER PUBLICATIONS

Azzalina, Brandon, TheImportanceofGroundingWhileWelding,httos://Awww.weldingforless.com/blogs/welders-blog/the-importance-of-grounding-while-welding)(Year:2020) (Year: 2020).*

* cited by examiner

*Primary Examiner* — Karen Kusumakar
*Assistant Examiner* — Shawn Shaw Muslim
(74) *Attorney, Agent, or Firm* — Xiaotun Qiu; Frank D. Cimino

(57) ABSTRACT

A method of assembling a flipchip semiconductor package, includes placing a semiconductor die having circuitry electrically coupled to bond pads with bumps having solder paste thereon onto bonding features of a package substrate. Arc welding is used using an arc welding apparatus including a biased electrode having a tip spaced apart from the solder paste, wherein electrical current generated by the arc welding melts the solder paste to provide a solder connection.

21 Claims, 2 Drawing Sheets

BUMP TO PACKAGE SUBSTRATE SOLDER JOINT

FIELD

This Disclosure relates to a flipchip semiconductor package.

BACKGROUND

A flipchip semiconductor package generally includes a solder connection between bumps on bond pads of a semiconductor die and bonding feature on a package substrate, such as leads of a leadframe. The bumps generally comprise solder balls or copper pillars. Upon placement of the semiconductor die on the package substrate, there is generally a solder reflow step performed at a temperature of at least 220° C. to form the solder joint.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize there can be reliability issues on flipchip devices due to non-wet or an insufficient solder joint connection induced by solder flux dry up and solder inactivation during flipchip die attach. This problem can be attributed to a long window of time between die attach and the solder reflow process.

Disclosed aspects include a method of assembling a flipchip semiconductor package, comprising placing a semiconductor die having circuitry electrically coupled to bond pads having a bump thereon generally comprising a solder ball or copper pillar, with solder paste thereon, onto bonding features of a package substrate. Arc welding is utilized using an arc welding apparatus comprising an arm and a biased electrode having a tip spaced apart from the solder paste, wherein electrical current generated by the arc welding melts the solder to provide a solder connection.

BRIEF DESCRIPTION OF DRAWINGS

Reference will now be made to the accompanying drawings, which are not necessarily drawn to scale, wherein.

DETAILED DESCRIPTION

Figure 1A:
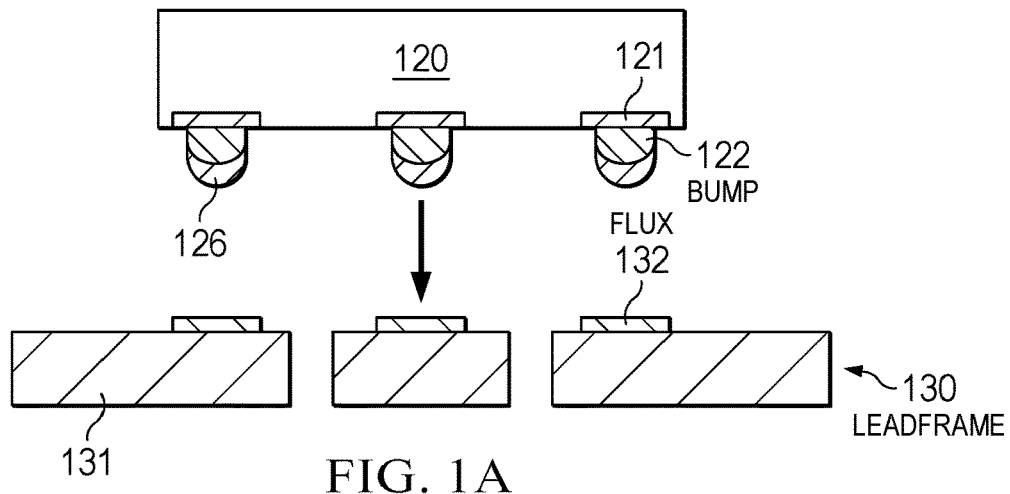
FIGS. 1A-1C are cross-sectional depictions showing steps in an example arc welding method for forming solder connections between a semiconductor die and bonding features of a package substrate, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Figure 1B:
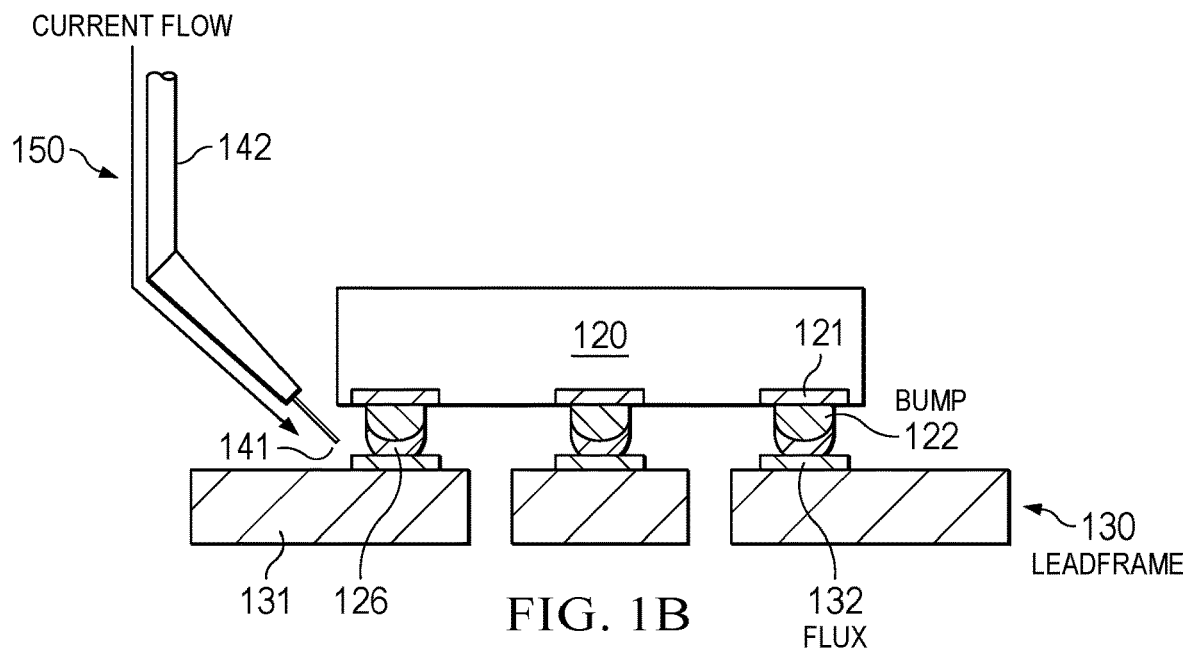
Figure 1C:
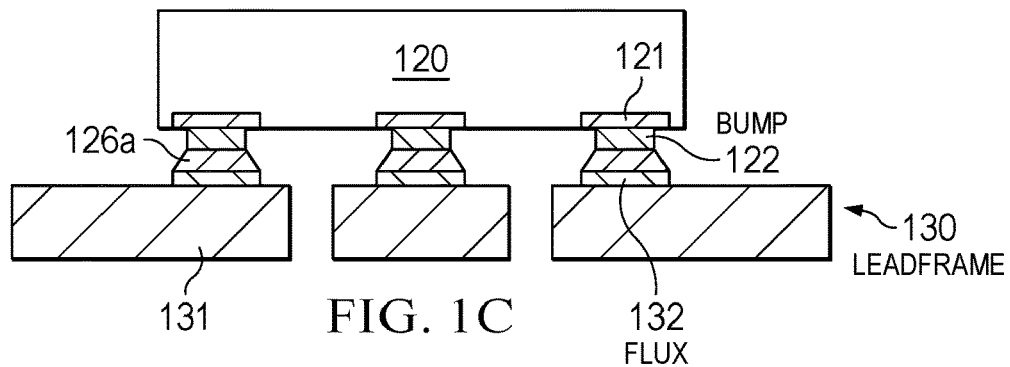

FIGS. 1A-1C are cross-sectional depictions showing steps in an example method for forming solder connections between a semiconductor die having bumps on its bond pads and bonding features of a package substrate, according to an example aspect. FIG. 1A shows a semiconductor die 120 having bond pads 121 with bumps 122 with solder paste 126 thereon after flipchip die attachment (shown by an arrow) to leads 131 (providing bonding features that may be also referred to being contact pads) of the package substrate shown as a leadframe 130 having optional solder flux 132 on the leads 131. All bond pads are positioned along a periphery of the semiconductor die and leads 131 along the periphery of the leadframe 130 or other package substrate to enable the arc welding process to occur.

Although not shown, there is generally under bump metallization (UBM) under the bump 122. Solder flux generally comprises a base solder material and an activator which is the chemical that promotes better wetting of the solder by removing oxides from the solder metal material. The package substrate can also comprise a printed circuit board (PCB), Roughened/Rough Lead Frame (RLF), Molded Interconnect Substrate (MIS), Etched Lead Frame, or a Pre-plated Lead Frame, that provides the bonding features.

FIG. 1B shows the arm 142 connected to a torch electrode tip (tip) 141 of an arc welding apparatus 150 after being placed in proximity to the solder paste 126. The arc welding apparatus 150 generally includes a motor for moving the arm 142 to move the arm for moving the tip 141. The arc welding apparatus generally can sense the distance between the tip and the solder paste 126. The arc welding apparatus generally has a position sensing device which may be similar to that used in conventional bonding process where there is typically a camera to locate the bond pads 121. With the aid of the camera, the arm 142 is moved so that the tip 141 is generally positioned about 0.05 mm to 0.2 mm from the solder paste 126 and at an angle of about 30° relative to the top surface of the package substrate for best results. Positioning the tip 141 less than 0.05 mm or greater than 0.2 mm from the solder paste can lead in some cases to partial, incomplete or less satisfactory reflow of solder paste 126.

There is generally no direct current return path provided for the arc welding apparatus, where the leadframe or other package substrate can instead be grounded indirectly by the holder of the package substrate which is itself grounded for the current to be terminated and a connection to the power supply of the arc welding apparatus to provide a ground for the power supply, and to also serve as a protection for the semiconductor die 120.

Arc welding as used herein takes on its conventional definition being a welding process that is used to join metal to metal by using electricity (displacement current) to create enough heat to melt metal, and the melted metals, when cool, result in a binding together of the respective metals. A welding power supply is used to create an electric arc between a metal stick (tip functioning as an electrode) and the base material to melt the metals at the point of contact. Arc welders can use either direct (DC) or alternating (AC) current.

FIG. 1C shows the device after high current induced melting of the solder paste to form solder wetting of the solder paste now shown as 126a. A package substrate such as a leadframe sheet having a plurality of leadframes is generally processed together. Moreover, a mold encapsulation step generally follows in the case of a molded package.

Figure 2:
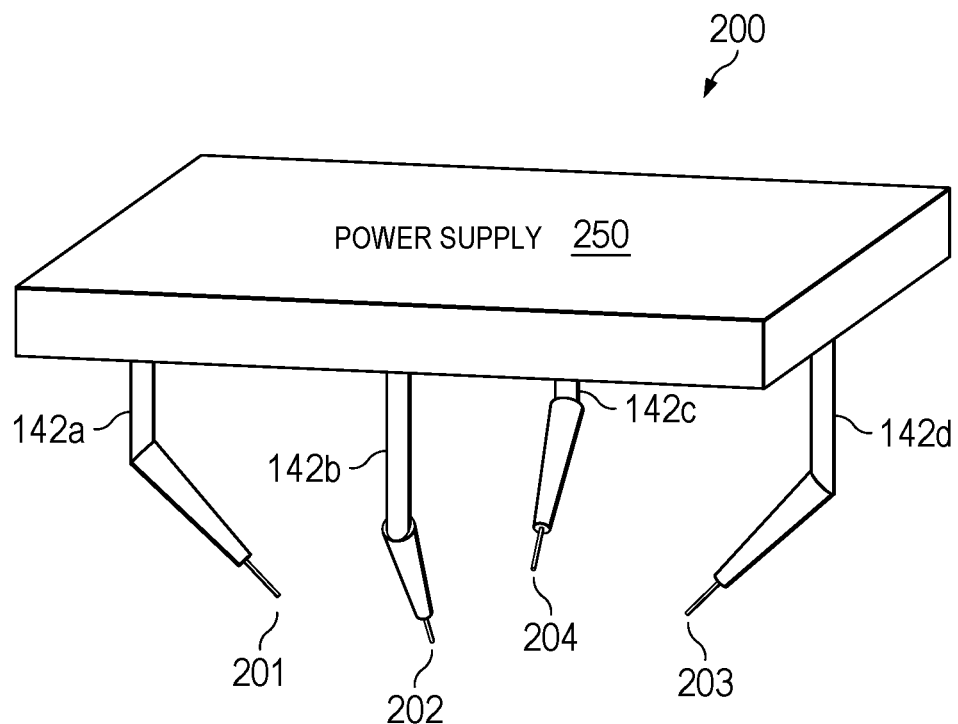
FIG. 2 depicts an optional arc welding apparatus for simultaneously forming a plurality of solder connections between a semiconductor die and bonding features of a package substrate, according to an example aspect.

FIG. 2 depicts an optional arc welding apparatus 200 having a plurality of arms 142a, 142b, 142c and 142d with electrodes having respective tips 201, 202, 203, 204 along with a power supply 250 having multiple channels for simultaneously forming a plurality of solder connections between bumps on bond pads of a semiconductor die and bonding features of a package substrate, according to an example aspect. In the depiction shown, tips 201 and 203 each provide solder processing for a solder connection in the plane of the page, tip 202 provides processing for solder connections coming out of the page, and tip 204 provides processing for solder connections going into the page.

Figure 3:
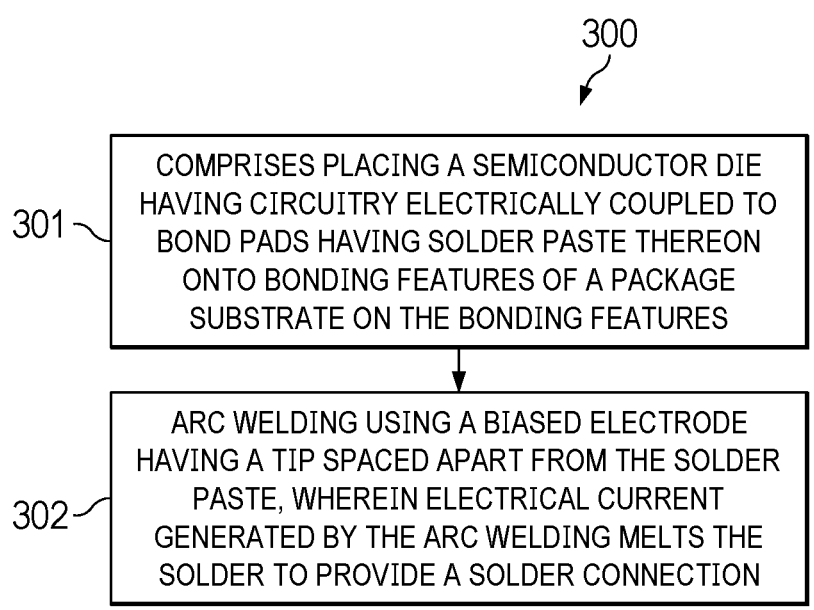
FIG. 3 shows steps in an example arc welding method of assembling a flipchip semiconductor device having solder joints, according to an example aspect.

FIG. 3 shows steps in an example method 300 of assembling a flipchip semiconductor device, according to an example aspect. Step 301 comprises placing a semiconductor die having circuitry electrically coupled to bond pads having bumps with solder paste thereon onto bonding features of a package substrate on the bonding features. Step 302 comprises arc welding using a biased electrode having a tip spaced apart from the solder paste. Current is induced by the electrode, positioned at an angle generally from 15 to 45°, such as –30° from the package substrate, onto the solder paste. Electrical displacement current is generated by the arc welding melts the solder paste for best results. Positioning the electrode at an angle less than 15 or greater than 45 (degrees) from the package substrate can lead in some cases to partial, incomplete or less satisfactory reflow of solder paste 126. Each solder contact can utilize a separate applying current step, or using a suitable multi-channel arc welding apparatus as described above in FIG. 2 shown as 200 where a plurality of solder contacts can be formed simultaneously.

The bumps can include pillars or solder balls. The method generally excludes a solder reflow step. The method can include flux washing after the application of the electrical current. As noted above, the arc welding apparatus used for the method can include a plurality of biased electrodes, wherein the arc welding simultaneously forms a plurality of the solder connections.

The package substrate can comprise a leadframe, where the bonding features comprise leads. The tip can be positioned at an angle from 15 to 45° relative to a normal drawn from a top surface of the package substrate. The bond pads are generally all positioned along a periphery of the semiconductor die, such as being in a rectangular or circular shape. The electrical current can be in a range from 60 mA to 200 mA and can be applied for a time between 0.5 msec- and 1.3 msec solder paste for best results. Using electrical current outside the range of 60 mA to 200 mA and/or applying the electrical current for a time outside the range of 0.5 msec and 1.3 msec can lead in some cases to partial, incomplete or less satisfactory reflow of solder paste 126.

The invention claimed is:

1. A method of assembling a flipchip semiconductor package, comprising:
    placing a semiconductor die having circuitry electrically coupled to bond pads having bumps with solder paste thereon onto bonding features of a package substrate; and
    arc welding using a biased electrode having a tip spaced apart from the solder paste, wherein electrical current generated by the arc welding melts the solder paste to provide a solder connection, wherein an arc welding apparatus used includes a plurality of biased electrodes, and wherein a first biased electrode and a second biased electrode are configured to form solder connections in a first plane and a third biased electrode and a fourth biased electrode are configured to form solder connections in a second plane, perpendicular to the first plane.

2. The method of claim 1, wherein the bumps comprise solder balls or pillars.

3. The method of claim 1, wherein the method excludes a solder reflow step.

4. The method of claim 1, further comprising flux washing after applying the electrical current.

5. The method of claim 1, wherein the arc welding simultaneously forms a plurality of solder connections.

6. The method of claim 1, wherein the package substrate comprises a leadframe, and wherein the bonding features comprise leads.

7. The method of claim 1, wherein the tip is positioned at an angle from 15° to 45° relative to a normal drawn from a top surface of the package substrate.

8. The method of claim 1, wherein the bond pads are all positioned along a periphery of the semiconductor die.

9. The method of claim 1, wherein the electrical current is in a range from 60 mA to 200 mA.

10. The method of claim 1, wherein the electrical current is applied for a time between 0.5 msec and 1.3 msec.

11. The method of claim 1, wherein there is solder flux on the bonding features.

12. A method of assembling a semiconductor package, comprising:
    placing a semiconductor die having circuitry electrically coupled to electrical contacts with solder paste thereon onto bonding features of a package substrate; and
    arc welding using a biased electrode having a tip spaced apart from the solder paste, wherein electrical current generated by the arc welding melts the solder paste to provide a solder connection, wherein an arc welding apparatus used includes a plurality of biased electrodes, and wherein a first biased electrode and a second biased electrode are configured to form solder connections in a first plane and a third biased electrode and a fourth biased electrode are configured to form solder connections in a second plane, perpendicular to the first plane.

13. The method of claim 12, wherein the package substrate comprises a leadframe, and wherein the bonding features comprise leads.

14. The method of claim 12, wherein the tip is positioned at an angle from 15° to 45° relative to a normal drawn from a top surface of the package substrate.

15. The method of claim 12, wherein the bond pads are all positioned along a periphery of the semiconductor die.

16. The method of claim 12, wherein the electrical current is in a range from 60 mA to 200 mA.

17. The method of claim 12, wherein the electrical current is applied for a time between 0.5 msec and 1.3 msec.

18. The method of claim 12, wherein the electrical contacts comprise pillars.

19. The method of claim 12, wherein the electrical contacts comprise solder balls.

20. The method of claim 12, wherein the method excludes a solder reflow step.

21. A method of assembling a semiconductor package, comprising:
    placing a semiconductor die having circuitry electrically coupled to electrical contacts with solder paste thereon onto bonding features of a package substrate; and
    generating an arc using a biased electrode having a tip spaced apart from the solder paste to melt the solder paste to provide a solder connection, wherein an arc generating apparatus used includes a plurality of biased electrodes and wherein a first biased electrode and a second biased electrode are configured to form solder connections in a first plane and a third biased electrode and a fourth biased electrode are configured to form solder connections in a second plane, perpendicular to the first plane.

* * * * *